United States Patent
Maruyama

(10) Patent No.: US 10,770,577 B2
(45) Date of Patent: Sep. 8, 2020

(54) RECTIFIER AND ROTATING ELECTRIC MACHINE INCLUDING RECTIFIER

(71) Applicant: DENSO CORPORATION, Kariya, Aichi-pref. (JP)

(72) Inventor: Toshinori Maruyama, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/250,367

(22) Filed: Jan. 17, 2019

(65) Prior Publication Data

US 2019/0237574 A1 Aug. 1, 2019

(30) Foreign Application Priority Data

Jan. 26, 2018 (JP) ................. 2018-011147

(51) Int. Cl.

| | | |
|---|---|---|
| *H01L 29/78* | (2006.01) | |
| *H01L 27/07* | (2006.01) | |
| *H01L 29/866* | (2006.01) | |
| *H01L 27/02* | (2006.01) | |
| *H01L 27/095* | (2006.01) | |
| *H01L 29/872* | (2006.01) | |

(Continued)

(52) U.S. Cl.
CPC ...... *H01L 29/7808* (2013.01); *H01L 27/0255* (2013.01); *H01L 27/0727* (2013.01); *H01L 27/095* (2013.01); *H01L 29/7806* (2013.01); *H01L 29/7813* (2013.01); *H01L 29/866* (2013.01); *H01L 29/872* (2013.01); *H02K 11/046* (2013.01); *H02K 19/36* (2013.01); *H02M 1/08* (2013.01); *H02K 9/06* (2013.01)

(58) Field of Classification Search
CPC ............. H01L 29/7808; H01L 29/7806; H01L 29/7813; H01L 29/866; H01L 29/872; H01L 27/0255; H01L 27/095
See application file for complete search history.

(56) References Cited

U.S. PATENT DOCUMENTS 6,049,108 A 4/2000 Williams et al.
9,966,870 B2 * 5/2018 Kondo .................. H02M 5/458
(Continued)

FOREIGN PATENT DOCUMENTS

JP 2005-045905 A 2/2005

*Primary Examiner* — Nathan W Ha
(74) *Attorney, Agent, or Firm* — Oliff PLC

(57) ABSTRACT

A rectifier has a rectification circuit configured to rectify multi-phase alternating current generated by a rotating electric machine into direct current. The rectifier includes upper-arm semiconductor switching elements included in an upper arm of the rectification circuit, upper-arm protection diodes included in the upper arm and each being electrically connected in parallel with one of the upper-arm semiconductor switching elements, lower-arm semiconductor switching elements included in a lower arm of the rectification circuit, and lower-arm protection diodes included in the lower arm and each being electrically connected in parallel with one of the lower-arm semiconductor switching elements. Each of the upper-arm and lower-arm protection diodes is configured to have, when a reverse voltage higher than a breakdown voltage of the protection diode is applied to the protection diode, an operating resistance that is higher than three times an operating resistance of any of the upper-arm and lower-arm semiconductor switching elements.

12 Claims, 9 Drawing Sheets

(51) Int. Cl.
    *H02K 11/04*     (2016.01)
    *H02K 19/36*     (2006.01)
    *H02M 1/08*     (2006.01)
    *H02K 9/06*     (2006.01)

(56) References Cited

U.S. PATENT DOCUMENTS

| | | | |
|---|---|---|---|
| 10,079,536 B2* | 9/2018 | Ishimaru | H02M 1/36 |
| 10,297,516 B2* | 5/2019 | Nagamatsu | H01L 23/12 |
| 10,304,761 B2* | 5/2019 | Kawano | H01L 23/3114 |
| 2010/0200920 A1* | 8/2010 | Su | H01L 27/0255 |
| | | | 257/355 |
| 2011/0291186 A1* | 12/2011 | Yilmaz | H01L 29/4236 |
| | | | 257/334 |
| 2013/0020576 A1* | 1/2013 | Hsieh | H01L 27/0629 |
| | | | 257/66 |
| 2016/0315184 A1 | 10/2016 | Ishimaru et al. | |
| 2016/0343848 A1* | 11/2016 | Bartels | H01L 29/7808 |
| 2017/0263598 A1* | 9/2017 | Arai | H01L 27/0255 |
| 2017/0338336 A1* | 11/2017 | Nasu | H01L 29/41758 |
| 2019/0215992 A1 | 7/2019 | Maruyama | |

* cited by examiner

FRONT SIDE ←——————→ REAR SIDE
AXIAL DIRECTION

RECTIFIER AND ROTATING ELECTRIC MACHINE INCLUDING RECTIFIER

CROSS-REFERENCE TO RELATED APPLICATION

This application is based on and claims priority from Japanese Patent Application No. 2018-11147 filed on Jan. 26, 2018, the contents of which are hereby incorporated by reference in their entirety into this application.

BACKGROUND

1. Technical Field

The present disclosure relates to rectifiers and rotating electric machines that include the rectifiers.

2. Description of Related Art

Conventionally, alternators include rectification circuits that are configured to rectify alternating current generated by the alternators into direct current with which batteries can be charged. Moreover, the rectification circuits generally employ diodes as rectifying elements. However, rectification by the diodes results in high loss.

To solve the above problem, semiconductor switching elements, such as MOSFETs, may be employed instead of the diodes in the rectification circuits.

For example, Japanese Patent Application Publication No. JP2015116053A discloses a rectifying element (or semiconductor device) which includes a MOSFET (Metal-Oxide-Semiconductor Field-Effect Transistor) and a Zener diode electrically connected between the drain and the source of the MOSFET to absorb surge.

However, the inventor of the present application has found the following problems with the rectifying element disclosed in the above patent document.

When a battery terminal, which is normally connected with an output terminal of the alternator, is disconnected from the output terminal and thus the electrical load of the alternator is suddenly reduced during the power-generating operation of the alternator, there occurs excessive surge current which is referred to as "load dump". Moreover, among a plurality of electrical paths in the rectification circuit, the surge current may concentrate on one electrical path where the breakdown voltage of the Zener diode against the reverse voltage is relatively low.

The Zener diode may be configured to be capable of sufficiently absorbing the surge current when the surge current is concentrated on the one electrical path. However, in this case, the size of the Zener diode would become large, reducing the space available for arrangement of the MOSFET in the rectifying element. Moreover, other components of the rectifying element may be damaged by heat generated by the Zener diode when the surge current is concentrated on the one electrical path.

SUMMARY

According to the present disclosure, there is provided a rectifier for a rotating electric machine. The rotating electric machine includes a rotating shaft, a rotor fixed on the rotating shaft to rotate together with the rotating shaft, and a stator configured to generate multi-phase alternating current therein with rotation of the rotor. The rectifier has a rectification circuit formed therein. The rectification circuit is configured as a multi-phase bridge circuit, which has an upper arm and a lower arm, to rectify the multi-phase alternating current generated in the stator into direct current. The rectifier includes: a plurality of upper-arm semiconductor switching elements for respective phases included in the upper arm of the rectification circuit; a plurality of upper-arm protection diodes for respective phases included in the upper arm of the rectification circuit, each of the upper-arm protection diodes being electrically connected in parallel with one of the upper-arm semiconductor switching elements which is of the same phase as the upper-arm protection diode; a plurality of lower-arm semiconductor switching elements for respective phases included in the lower arm of the rectification circuit; and a plurality of lower-arm protection diodes for respective phases included in the lower arm of the rectification circuit, each of the lower-arm protection diodes being electrically connected in parallel with one of the lower-arm semiconductor switching elements which is of the same phase as the lower-arm protection diode. Moreover, each of the upper-arm and lower-arm protection diodes is configured to have, when a reverse voltage higher than a breakdown voltage of the protection diode is applied to the protection diode, an operating resistance that is higher than three times an operating resistance of any of the upper-arm and lower-arm semiconductor switching elements.

With the above configuration, when a surge voltage is applied from the stator to the rectification circuit of the rectifier, a reverse voltage is applied to each of the protection diodes of the upper and lower arms of the rectification circuit. The reverse voltage may exceed the breakdown voltages of the protection diodes of either of the upper and lower arms, thereby turning on these protection diodes. According to the present disclosure, the operating resistance of each of the protection diodes is higher than three times the operating resistance of any of the semiconductor switching elements. Therefore, increase in the surge current flowing through the turned-on protection diodes is limited. Hence, when surge paths are first formed in one of the upper and lower arms, increase in the surge current flowing through the surge paths is limited, causing surge paths to be formed in the other of the upper and lower arms as well. Consequently, the surge current is not concentrated on the one of the upper and lower arms, but distributed to both of the upper and lower arms. As a result, it becomes possible to reliably absorb the surge current while suppressing generation of heat in the protection diodes due to the surge current.

It is preferable that the operating resistance of each of the upper-arm and lower-arm protection diodes is higher than 6 mΩ. In this case, it is possible to reliably cope with variation in the breakdown voltages of the upper-arm and lower-arm protection diodes due to manufacturing tolerances.

On the other hand, when the operating resistance of the upper-arm and lower-arm protection diodes is too high, the voltage drop due to the operating resistance of each of the upper-arm and lower-arm protection diodes will become too large with increase in the surge current flowing therethrough. Consequently, it may become impossible to reliably absorb the surge current.

Accordingly, it is preferable that the operating resistance of each of the upper-arm and lower-arm protection diodes is lower than 50 mΩ. In this case, it is possible to reliably absorb the surge current while reliably coping with variation in the breakdown voltages of the upper-arm and lower-arm protection diodes due to manufacturing tolerances.

In a further implementation, each of the upper-arm and lower-arm semiconductor switching elements is a MOSFET.

The withstand voltage of the MOSFET against a reverse voltage applied between a drain and a source of the MOSFET is higher than the breakdown voltage of each of the upper-arm and lower-arm protection diodes. Consequently, when the surge voltage is applied to the rectification circuit of the rectifier, the surge current reliably flows through the upper-arm and lower-arm protection diodes without any reverse current flowing through the MOSFET.

Moreover, the rectifier further includes a controller that controls switching of the MOSFET based on a voltage between the drain and the source of the MOSFET. The controller is electrically connected between the drain and the source of the MOSFET in parallel with the MOSFET. The withstand voltage of the controller against the reverse voltage applied between the drain and the source of the MOSFET is higher than the withstand voltage of the MOSFET against the reverse voltage. Consequently, it is possible to reliably prevent the surge current from flowing through the controller that is most sensitive to the surge current.

In a first embodiment, each of the upper-arm and lower-arm protection diodes is formed of a semiconductor wafer having a first thickness. Each of the upper-arm and lower-arm semiconductor switching elements is formed of a semiconductor wafer having a second thickness. The first thickness is greater than three times the second thickness. Consequently, it is possible to easily and reliably set the operating resistance of each of the upper-arm and lower-arm protection diodes to be higher than three times the operating resistance of any of the upper-arm and lower-arm semiconductor switching elements.

In a second embodiment, each of the upper-arm and lower-arm protection diodes is implemented by a Zener diode. Moreover, the upper-arm and lower-arm protection diodes are integrally formed with the upper-arm and lower-arm semiconductor switching elements on a same semiconductor wafer. Consequently, heat generated in the upper-arm and lower-arm protection diodes will be transferred to the upper-arm and lower-arm semiconductor switching elements adjacent to the upper-arm and lower-arm protection diodes, thereby being effectively dissipated.

In a third embodiment, each of the upper-arm and lower-arm protection diodes is implemented by a Schottky diode, and each of the upper-arm and lower-arm semiconductor switching elements is implemented by a MOSFET. Moreover, the upper-arm and lower-arm protection diodes are integrally formed with the upper-arm and lower-arm semiconductor switching elements on a same semiconductor wafer. Consequently, heat generated in the upper-arm and lower-arm protection diodes will be transferred to the upper-arm and lower-arm semiconductor switching elements adjacent to the upper-arm and lower-arm protection diodes, thereby being effectively dissipated. Moreover, with the Schottky diodes employed as the upper-arm and lower-arm protection diodes, it is possible to suppress a positive voltage surge to the drains of the MOSFETs that are employed as the upper-arm and lower-arm semiconductor switching elements. Furthermore, with the forward voltage of the Schottky diodes lower than the forward voltage of parasitic diodes formed in the MOSFETs, it is possible to prevent overcurrent from flowing to the parasitic diodes when a negative voltage is applied to the drains of the MOSFETs.

In the second and third embodiments, it is preferable that: each of the upper-arm and lower-arm semiconductor switching elements is a MOSFET with a trench structure; and the upper-arm and lower-arm protection diodes are separated from one another by the trench structure. In this case, it is possible to easily form the upper-arm and lower-arm protection diodes respectively in those regions of the semiconductor wafer which are separated from one another by trenches. Consequently, it is possible to easily form the upper-arm and lower-arm protection diodes and the upper-arm and lower-arm semiconductor switching elements on the same semiconductor wafer.

DESCRIPTION OF EMBODIMENTS

Figure 1:
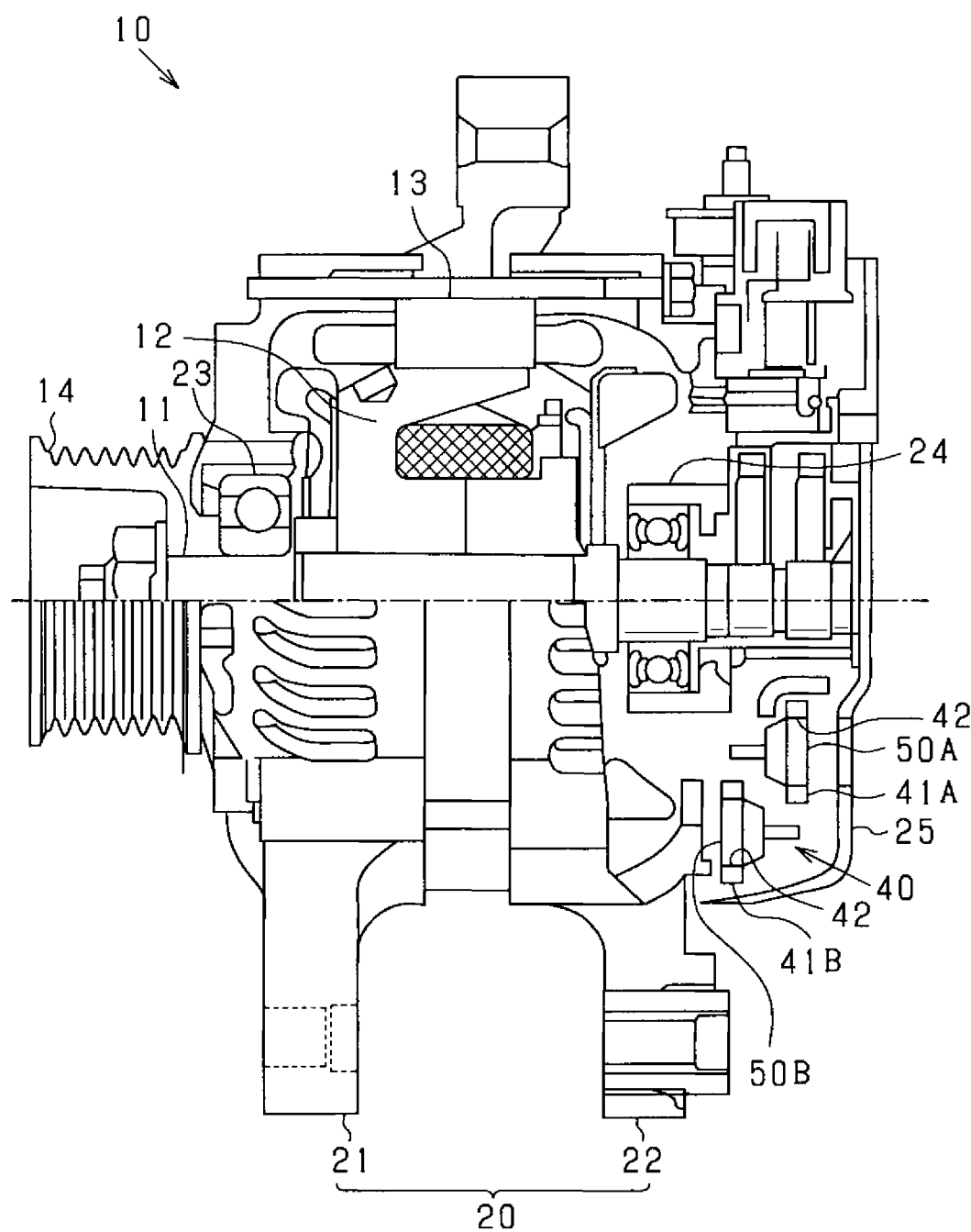
FIG. 1 is a partially cross-sectional view of a rotating electric machine which includes a rectifier according to a first embodiment.

Exemplary embodiments will be described hereinafter with reference to FIGS. 1-11. It should be noted that for the sake of clarity and understanding, identical components having identical functions throughout the whole description have been marked, where possible, with the same reference numerals in each of the figures and that for the sake of avoiding redundancy, descriptions of identical components will not be repeated.

First Embodiment

FIG. 1 shows the overall configuration of a rotating electric machine 10 which includes a rectifier 40 according to the first embodiment.

In the present embodiment, the rotating electric machine 10 is configured as an automotive alternator. More specifically, though not shown in the figures, the rotating electric machine 10 is mechanically connected to an output shaft of an engine of a vehicle via a connecting member (e.g., a belt) and driven by torque transmitted from the output shaft of the engine to rotate.

As shown in FIG. 1, the rotating electric machine 10 includes: a rotating shaft 11; a rotor 12 fixed on the rotating shaft 11 to rotate together with the rotating shaft 11; a stator 13 configured to generate three-phase alternating current therein with rotation of the rotor 12; a frame member 20 that holds both the rotor 12 and the stator 13; and the rectifier 40 that has rectification circuits 30 formed therein for rectifying the three-phase alternating current generated in the stator 13 into direct current.

In the present embodiment, the frame member 20 is composed of a front frame 21 and a rear frame 22 that are aligned in an axial direction of the rotating shaft 11 and joined by a plurality of bolts into one piece. In the frame member 20, there are formed a plurality of heat dissipation holes. Moreover, the frame member 20 is electrically connected to the vehicle body and thus grounded via the vehicle body.

In the present embodiment, the rotor 12 is configured as a Lundell-type rotor. Specifically, the rotor 12 includes a field coil and a pair of pole cores. The rotor 12 further has a pair of cooling fans respectively mounted to opposite axial end faces (or front and rear end faces) of the pole cores.

The rotating shaft 11 is rotatably supported by the frame member 20 via a pair of bearings 23 and 24 provided in the frame member 20. On a front end portion of the rotating shaft 11, there is mounted a pulley 14. In operation, the pulley 14 is driven by the engine of the vehicle via, for example, a belt (not shown) to rotate. Consequently, with rotation of the pulley 14, all of the rotating shaft 11, the rotor 12 and the cooling fans also rotate.

Figure 2:
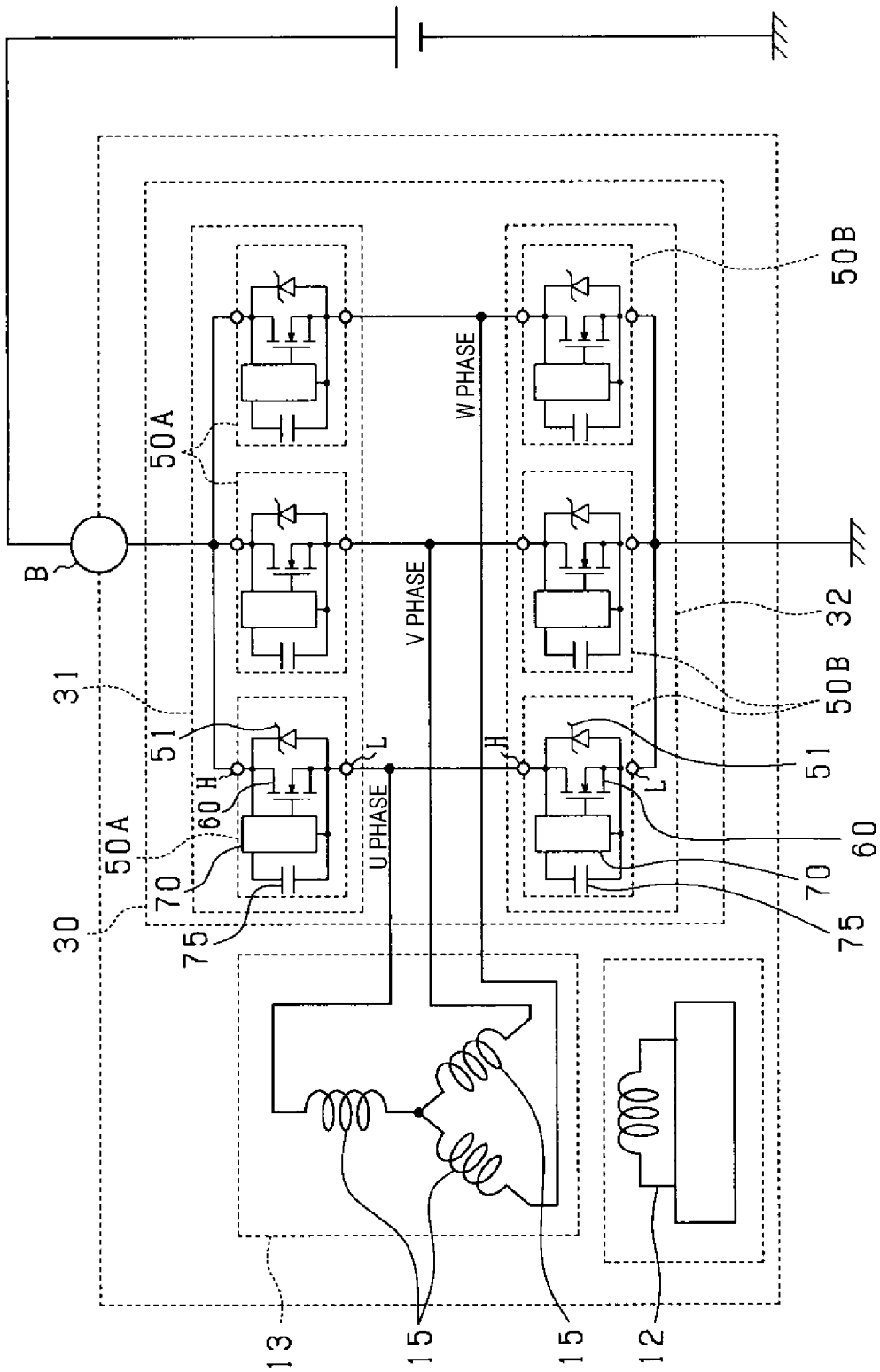
FIG. 2 is a circuit diagram illustrating the configuration of each of rectification circuits formed in the rectifier according to the first embodiment.

The stator 13 is disposed radially outside the rotor 12 so as to surround the rotor 12. In the present embodiment, the stator 13 includes an annular stator core and a pair of three-phase stator coils 15 wound on the stator core. The stator coils 15 have the same configuration; therefore, only one of the stator coils 15 is shown in FIG. 2. The stator 13 is fixedly sandwiched between the front frame 21 and the rear frame 22.

In addition, it should be noted that the number of phases of the stator coils 15 may alternatively be two, or four or more. It also should be noted that the number of the stator coils 15 included in the stator 13 may alternatively be one, or three or more.

On the outer side of the rear frame 22 (i.e., on the opposite side of the rear frame 22 to the rotor 12 and the stator 13) in the axial direction of the rotating shaft 11, there is mounted, as an insulating cover, a rear cover 25 that is made of an electrically-insulative synthetic resin. In a space formed between the rear frame 22 and the rear cover 25, there is received the rectifier 40. In addition, in the space formed between the rear frame 22 and the rear cover 25, there are also received a voltage regulator that regulates the output voltage of the rotating electric machine 10 and a field coil energization mechanism.

The rectifier 40 is provided axially outside the frame member 20. The rectifier 40 includes a first heat sink (or heat dissipation plate) 41A, a second heat sink 41B, a plurality (more particularly, six in the present embodiment) of first rectifying elements 50A mounted to the first heat sink 41A, and a plurality (more particularly, six in the present embodiment) of second rectifying elements 50B mounted to the second heat sink 41B. The first heat sink 41A and the second heat sink 41B are located to overlap each other in the axial direction of the rotating shaft 11. Moreover, the second heat sink 41B is located closer than the first heat sink 41A to the frame member 20 (i.e., located on the front side of the first heat sink 41A).

In addition, hereinafter, the first heat sink 41A and the second heat sink 41B will be together simply referred to as the heat sinks 41; the first rectifying elements 50A and the second rectifying elements 50B will be together simply referred to as the rectifying elements 50.

In the first heat sink 41A, there are formed six mounting holes 42 in which the six first rectifying elements 50A are respectively mounted. Similarly, in the second heat sink 41B, there are formed six mounting holes 42 in which the six second rectifying elements 50B are respectively mounted. Three of the six first rectifying elements 50A and three of the six second rectifying elements 50B together serve to rectify three-phase alternating current generated in one of the pair of three-phase stator coils 15; the remaining three first rectifying elements 50A and the remaining three second rectifying elements 50B together serve to rectify three-phase alternating current generated in the other three-phase stator coil 15.

More specifically, each of the heat sinks 41 is made of an electrically-conductive metal plate having high heat conductivity. Moreover, to prevent interference with the rotating shaft 11 and secure a sufficient heat dissipation area, each of the heat sinks 41 is arc-shaped and arranged around the rotating shaft 11. In each of the heat sinks 41, the six mounting holes 42 are arranged in the circumferential direction. Each of the mounting holes 42 is formed to penetrate the heat sink 41 in the thickness direction thereof (or in the axial direction of the rotating shaft 11). In each of the mounting holes 42, there is press-fitted one of the rectifying elements 50.

In the first heat sink 41A, there is formed an output terminal B (see FIG. 2) of the rotating electric machine 10 at a circumferential end of the arc-shaped first heat sink 41A. On the other hand, the second heat sink 41B is electrically connected to the frame member 20 and thus grounded via the frame member 20.

As described previously, in the present embodiment, the stator 13 includes the pair of three-phase stator coils 15. Accordingly, in the rectifier 40, there are formed a pair of rectification circuits 30 respectively corresponding to the pair of three-phase stator coils 15.

FIG. 2 shows the configuration of each of the rectification circuits 30 formed in the rectifier 40.

In addition, the rectification circuits 30 have the same configuration; therefore, only one of the rectification circuits 30 is shown in FIG. 2.

As shown in FIG. 2, in the present embodiment, each of the rectification circuits 30 is configured to full-wave rectify three-phase alternating current generated in a corresponding one of the stator coils 15 of the stator 13. More specifically, each of the rectification circuits 30 is configured as a three-phase (i.e., U, V and W phases) bridge circuit having an upper arm 31 and a lower arm 32. The upper arm 31 is constituted of three first rectifying elements 50A. The lower arm 32 is constituted of three second rectifying elements 50B.

Moreover, in the present embodiment, each of the stator coils 15 includes three phase windings that are Y-connected to define a neutral point therebetween. In each of the rectification circuits 30, each of the first rectifying elements 50A and the second rectifying elements 50B is electrically connected to an end of a corresponding one of the three phase windings of the corresponding stator coil 15.

It should be noted that the three phase windings of each of the stator coils 15 may alternatively be Δ-connected.

In the present embodiment, each of the rectifying elements 50 has two terminals. Therefore, each of the rectification circuits 30 formed in the rectifier 40 may have the same configuration as a conventional rectification circuit that employs diodes as rectifying elements. Specifically, each of the first rectifying elements 50A has its low-potential terminal L connected to a corresponding one of the three phase windings of the corresponding stator coil 15 and its high-potential terminal H connected to the output terminal B of the rotating electric machine 10. Moreover, to the output terminal B, there are connected a battery and electrical loads provided in the vehicle. On the other hand, each of the second rectifying elements 50B has its high-potential terminal H connected to a corresponding one of the three phase windings of the corresponding stator coil 15 and its low-potential terminal L grounded.

Figure 3:
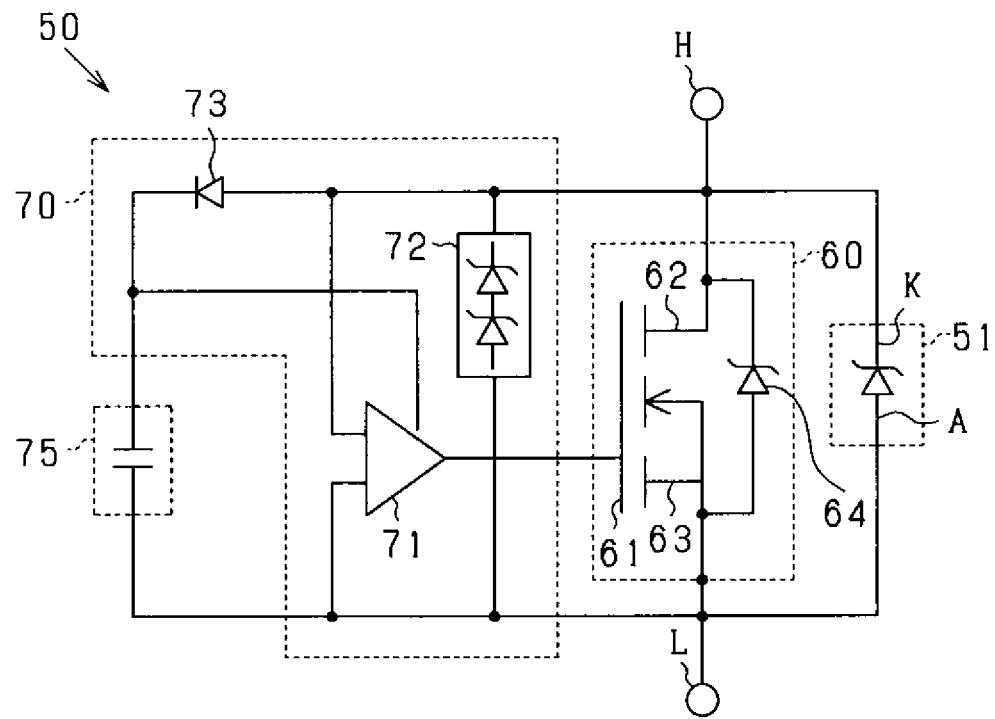
FIG. 3 is a circuit diagram illustrating the circuit configuration of each of rectifying elements of the rectifier according to the first embodiment.

FIG. 3 shows the circuit configuration of each of the rectifying elements 50 of the rectifier 40.

As shown in FIG. 3, in the present embodiment, each of the rectifying elements 50 includes a MOSFET (Metal-Oxide-Semiconductor Field-Effect Transistor) 60, a control IC (Integrated Circuit) 70, a capacitor 75 and a Zener diode 51. Here, the Zener diode 51 corresponds to a "protection diode" and the MOSFET 60 corresponds to a "semiconductor switching element".

It should be noted that other surge-absorbing diodes to which a reverse voltage can be applied, such as a Schottky diode, may be employed instead of the Zener diode 51. Moreover, it also should be noted that other semiconductor switching elements, such as an IGBT (Insulated Gate Bipolar Transistor), may be employed instead of the MOSFET 60.

In the present embodiment, the MOSFET 60 is implemented by an N-type MOSFET. The MOSFET 60 has its gate 61 electrically connected to the control IC 70, its drain 62 electrically connected to the high-potential terminal H of the rectifying element 50, and its source 63 electrically connected to the low-potential terminal L of the rectifying element 50. Moreover, between the drain 62 and the source 63, there is electrically connected a parasitic diode 64. The withstand voltage of the MOSFET 60 against a reverse voltage depends on the parasitic diode 64.

The control IC 70 is connected between the high-potential terminal H and the low-potential terminal L in parallel with the MOSFET 60. The control IC 70 includes a comparator 71 for comparing the electric potential at the high-potential terminal H and the electric potential at the low-potential terminal L and a protection element 72 for protecting the control IC 70 from a reverse voltage. The withstand voltage of the control IC 70 against a reverse voltage depends on the protection element 72.

The comparator 71 compares the electric potential at the high-potential terminal H and the electric potential at the low-potential terminal L. Moreover, depending on the result of the comparison, the comparator 71 applies a gate voltage to the gate 61, thereby turning on the MOSFET 60. More specifically, when the electric potential at the low-potential terminal L becomes higher than the electric potential at the high-potential terminal H, the comparator 71 applies the gate voltage to the gate 61, thereby turning on the MOSFET 60. Moreover, when the electric potential at the low-potential terminal L becomes lower than the electric potential at the high-potential terminal H, the comparator 71 stops the application of the gate voltage to the gate 61, thereby turning off the MOSFET 60.

The capacitor 75 is electrically connected to the control IC 70 to apply a voltage for driving the control IC 70. The capacitor 75 is also electrically connected to the high-potential terminal H and the low-potential terminal L via the control IC 70. Moreover, between the capacitor 75 and the high-potential terminal H, there is electrically connected a reverse current prevention diode 73 which is provided in the control IC 70. In addition, the capacitor 75 is charged by the voltage between the high-potential terminal H and the low-potential terminal L.

The Zener diode 51 is connected between the high-potential terminal H and the low-potential terminal L in parallel with the MOSFET 60. More specifically, the Zener diode 51 has its cathode K connected to the high-potential terminal H (or to the drain 62 of the MOSFET 60) and its anode A connected to the low-potential terminal L (or the source 63 of the MOSFET 60).

Next, operation of the rectification circuits 30 will be described with reference to FIG. 2.

As shown in FIG. 2, in each of the rectification circuits 30, there are provided three pairs of the first rectifying elements 50A and the second rectifying elements 50B, which respectively correspond to the U, V and W phases.

It should be noted that for the sake of simplicity, in FIG. 2, only the U-phase first rectifying element 50A and the U-phase second rectifying element 50B have their components designated by the respective reference numerals.

In addition, the rectifying operation is the same for all the three pairs of the first rectifying elements 50A and the second rectifying elements 50B. Therefore, only the rectifying operation of the pair of the U-phase first and second rectifying elements 50A and 50B will be described hereinafter.

When the U-phase output voltage of the stator coil 15 increases to cause the electric potential at the low-potential terminal L of the U-phase first rectifying element 50A (or the electric potential at the source 63 of the U-phase upper-arm MOSFET 60) to become higher than the electric potential at the high-potential terminal H of the U-phase first rectifying element 50A (or the electric potential at the drain 62 of the U-phase upper-arm MOSFET 60), the comparator 71 of the control IC 70 of the U-phase first rectifying element 50A applies the gate voltage to the gate 61 of the U-phase upper-arm MOSFET 60, thereby turning on the U-phase upper-arm MOSFET 60. Consequently, it becomes possible for the U-phase current to flow through the U-phase upper-arm MOSFET 60.

Moreover, when the U-phase output voltage of the stator coil 15 drops to cause the electric potential at the low-potential terminal L of the U-phase first rectifying element 50A to become lower than the electric potential at the high-potential terminal H of the U-phase first rectifying element 50A, the comparator 71 of the control IC 70 of the U-phase first rectifying element 50A stops the application of the gate voltage to the gate 61 of the U-phase upper-arm MOSFET 60, thereby turning off the U-phase upper-arm MOSFET 60. Consequently, it becomes impossible for the U-phase current to flow through the U-phase upper-arm MOSFET 60.

On the other hand, when the U-phase output voltage of the stator coil 15 drops to cause the electric potential at the high-potential terminal H of the U-phase second rectifying element 50B (or the electric potential at the drain 62 of the U-phase lower-arm MOSFET 60) to become lower than the electric potential at the low-potential terminal L of the U-phase second rectifying element 50B (or the electric potential at the source 63 of the U-phase lower-arm MOSFET 60), the comparator 71 of the control IC 70 of the U-phase second rectifying element 50B applies the gate voltage to the gate 61 of the U-phase lower-arm MOSFET 60, thereby turning on the U-phase lower-arm MOSFET 60. Consequently, it becomes possible for the U-phase current to flow through the U-phase lower-arm MOSFET 60.

Moreover, when the U-phase output voltage of the stator coil 15 increases to cause the electric potential at the high-potential terminal H of the U-phase second rectifying element 50B to become higher than the electric potential at the low-potential terminal L of the U-phase second rectifying element 50B, the comparator 71 of the control IC 70 of the U-phase second rectifying element 50B stops the application of the gate voltage to the gate 61 of the U-phase lower-arm MOSFET 60, thereby turning off the U-phase lower-arm MOSFET 60. Consequently, it becomes impossible for the U-phase current to flow through the U-phase lower-arm MOSFET 60.

Next, the structures of the rectifying elements 50 will be described with reference to FIGS. 4 and 5.

Figure 4:
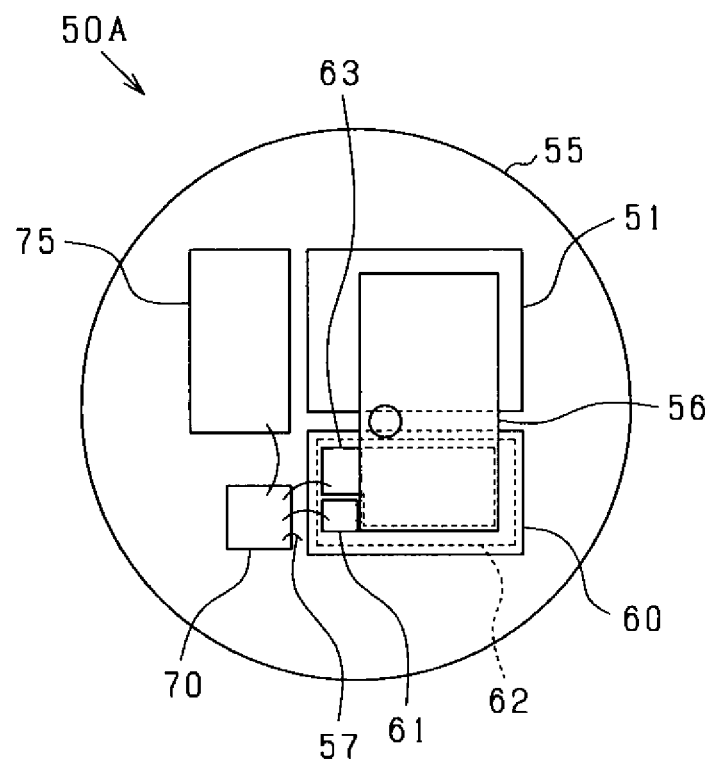
FIG. 4 is a plan view of one of the first rectifying elements of the rectifier according to the first embodiment.

FIG. 4 is a plan view of one of the first rectifying elements 50A, omitting a resin member 58 covering the first rectifying element 50A. FIG. 5 is a schematic cross-sectional view of one of the first rectifying elements 50A.

The structure of the first rectifying elements 50A is similar to the structure of the second rectifying elements 50B. Therefore, hereinafter, the structure of the first rectifying elements 50A will be described in detail; regarding the structure of the second rectifying elements 50B, only the differences thereof from the structure of the first rectifying elements 50A will be described.

Figure 5:
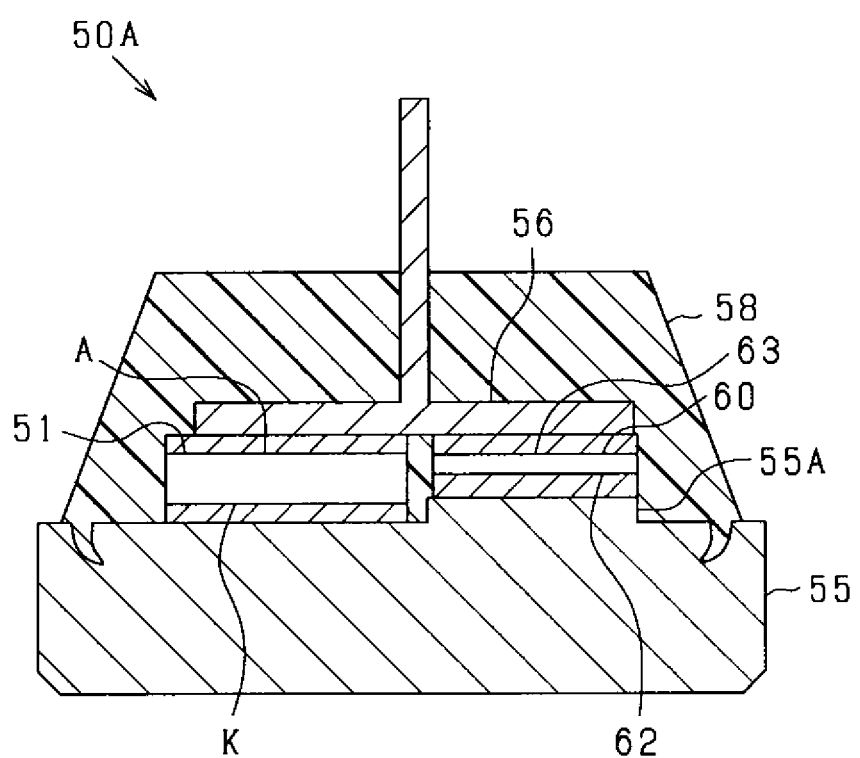
FIG. 5 is a schematic cross-sectional view of one of the first rectifying elements of the rectifier according to the first embodiment.

As shown in FIGS. 4 and 5, each of the first rectifying elements 50A includes a base electrode 55 and a lead electrode 56 in addition to the MOSFET 60, the control IC 70, the capacitor 75 and the Zener diode 51.

The base electrode 55 has a circular shape in plan view and is made of an electrically-conductive metal. The base electrode 55 is press-fitted in a corresponding one of mounting holes 42 formed in the first heat sink 41A (see FIG. 1). The base electrode 55 has an outer diameter equal to or slightly greater than an inner diameter of the corresponding mounting hole 42. Moreover, the base electrode 55 has a height (or axial dimension) equal to the thickness of the first heat sink 41A. The base electrode 55 is electrically connected to the first heat sink 41A. Consequently, all of the base electrodes 55 of the first rectifying elements 50A are electrically connected to each other via the first heat sink 41A.

As shown in FIG. 4, on the base electrode 55, there are arranged the MOSFET 60, the control IC 70, the capacitor 75 and the Zener diode 51, which are electrically connected via the electric wires 57.

As shown in FIGS. 4 and 5, the MOSFET 60 is formed into, for example, a rectangular chip. Moreover, the MOSFET 60 has a vertical structure such as a planar structure or a trench structure. The chip thickness of the MOSFET 60 is substantially equal to 50 µm. The MOSFET 60 has electrodes of the source 63 and the drain 62 respectively located on opposite major faces thereof. More specifically, on one of the major faces of the MOSFET 60, there are provided both the electrode of the source 63 and an electrode of the gate 61; on the other of the major faces, there is provided the electrode of the drain electrode 62. The electrode of the gate 61 of the MOSFET 60 is electrically connected to the control IC 70 via one of the electric wires 57.

The Zener diode 51 is also formed into, for example, a rectangular chip. The Zener diode 51 has a planar structure where a P layer is diffused into a substrate of an N− layer to form a P-N junction. The Zener diode 51 has an electrode of the anode A formed on one major face thereof and an electrode of the cathode K formed on the other major face thereof. The Zener diode 51 is located adjacent to the MOSFET 60. As shown in FIG. 4, to improve the heat dissipation performance, the chip size of the Zener diode 51 is set to be greater than the chip size of the MOSFET 60.

Moreover, as shown in FIG. 5, the chip thickness of the Zener diode 51 is set to be greater than three times the chip thickness of the MOSFET 60. More particularly, in the present embodiment, the chip thickness of the Zener diode 51 is set to 200 µm. That is, the thickness of a semiconductor wafer forming the chip of the Zener diode 51 (more specifically, the thickness of a semiconductor wafer between the electrode of the anode A and the electrode of the cathode K) is set to be greater than three times the thickness of a semiconductor wafer forming the chip of the MOSFET 60 (more specifically, the thickness of a semiconductor wafer between the electrode of the source 63 and the electrode of the drain 62).

To offset the difference between the chip thicknesses of the MOSFET 60 and the Zener diode 51, there is formed, as shown in FIG. 5, a protrusion 55A on that area of the surface of the base electrode 55 on which the MOSFET 60 is arranged. The protrusion 55A protrudes from the surface of the base electrode 55 by an amount equal to the difference between the chip thicknesses of the MOSFET 60 and the Zener diode 51. Consequently, with the protrusion 55A formed on the surface of the base electrode 55, those major faces of the MOSFET 60 and the Zener diode 51 which are on the opposite side to the base electrode 55 are located to be flush with each other in spite of the difference between the chip thicknesses of the MOSFET 60 and the Zener diode 51.

As shown in FIG. 5, the lead electrode 56 is provided on the opposite side of the MOSFET 60 and the Zener diode 51 to the base electrode 55. The lead electrode 56 has a plate-shaped part connected with both the MOSFET 60 and the Zener diode 51 and a cylindrical lead terminal.

It should be noted that since the lead electrode 56-side major faces of the MOSFET 60 and the Zener diode 51 (i.e., those major faces of the MOSFET 60 and the Zener diode 51 which are on the opposite side to the base electrode 55) are flush with each other, it becomes possible to have the plate-shaped part of the lead electrode 56 connected with both the MOSFET 60 and the Zener diode 51.

Moreover, as shown in FIG. 5, the base electrode 55 and all the components of the first rectifying element 50A provided on the base electrode 55 are covered with the resin member 58, with the lead terminal of the lead electrode 56 protruding outside the resin member 58.

In addition, as shown in FIG. 4, when viewed along the axial direction of the rotating shaft 11 (i.e., the direction perpendicular to the paper surface of FIG. 4), the lead terminal of the lead electrode 56 is located substantially at the center of the base electrode 55.

In the present embodiment, in each of the first rectifying elements 50A, both the electrode of the drain 62 of the MOSFET 60 and the electrode of the cathode K of the Zener diode 51 are connected and fixed to the base electrode 55 by soldering. On the other hand, both the electrode of the source 63 of the MOSFET 60 and the electrode of the anode A of the Zener diode 51 are connected and fixed to the lead electrode 56 by soldering. In addition, the base electrode 55 and the lead electrode 56 respectively correspond to the high-potential terminal H and the low-potential terminal L of the first rectifying element 50A.

In contrast, in each of the second rectifying elements 50B, though not shown in the figures, both the electrode of the source 63 of the MOSFET 60 and the electrode of the anode A of the Zener diode 51 are connected and fixed to the base electrode 55 via a block electrode by soldering. On the other hand, both the electrode of the drain 62 of the MOSFET 60 and the electrode of the cathode K of the Zener diode 51 are connected and fixed to the lead electrode 56 by soldering. In addition, the base electrode 55 and the lead electrode 56 respectively correspond to the low-potential terminal L and the high-potential terminal H of the second rectifying element 50B.

Next, with reference to FIG. 6, an explanation will be made of the flow of surge current in each of the rectification circuits 30 of the rectifier 40 when load dump occurs in the rotating electric machine 10.

When a disconnection or contact failure occurs in an external electrical path connected to the output terminal B of the rotating electric machine 10, a surge voltage (i.e., an excessively high voltage) is applied from the stator coils 15 to the rectification circuits 30 of the rectifier 40.

Figure 6:
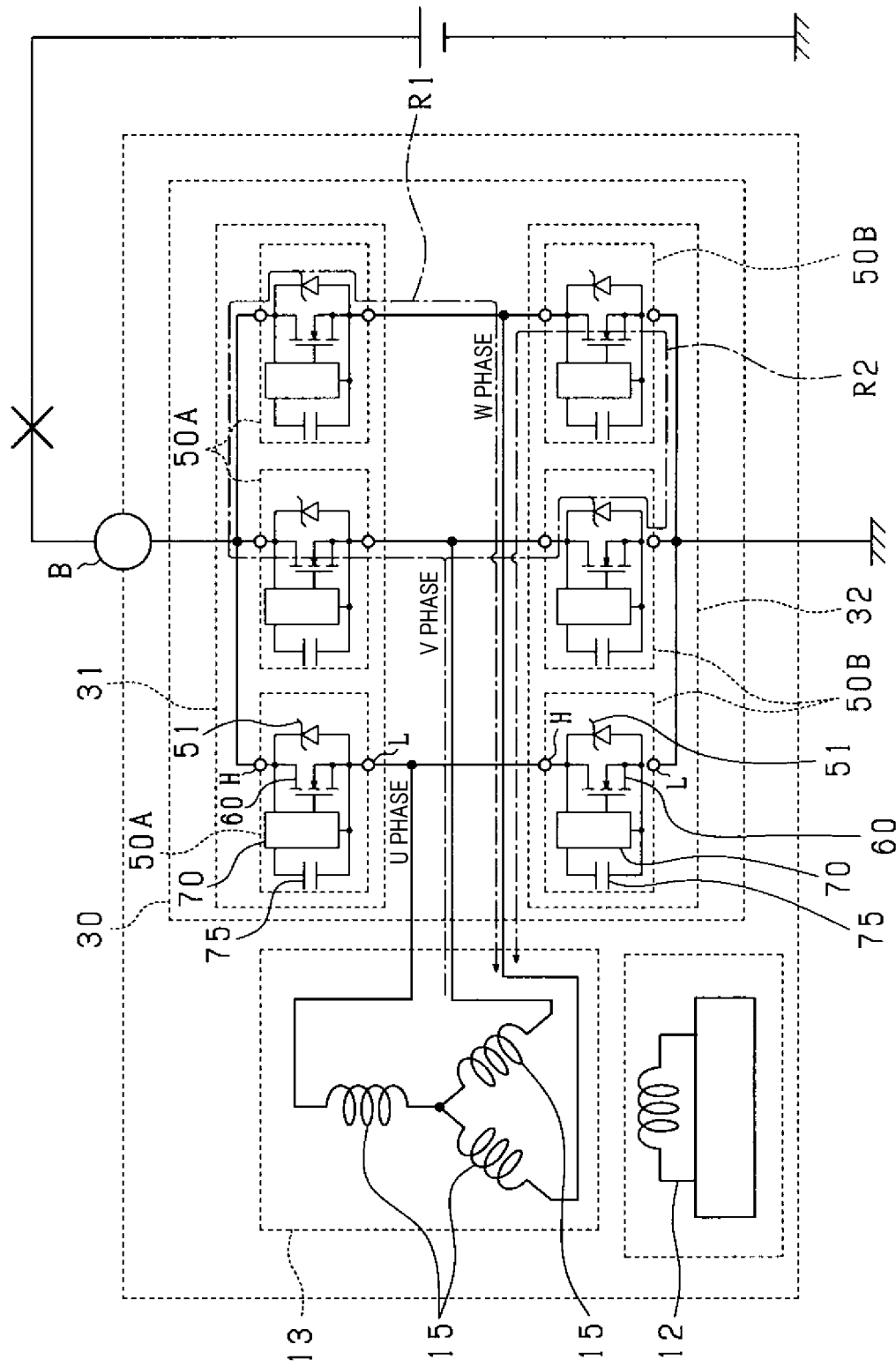
FIG. 6 is a schematic diagram illustrating the flow of surge current in each of the rectification circuits of the rectifier according to the first embodiment when load dump occurs in the rotating electric machine.

In this case, in each of the rectification circuits 30, it is ideal for the surge current to be distributed to two surge paths R1 and R2 respectively formed in the upper and lower arms 31 and 32 as shown with chain lines in FIG. 6. The surge path R1 is an electrical path along which the surge current flows from, for example, the V-phase winding of the stator coil 15 to the V-phase MOSFET 60 of the upper arm 31 and then further to, for example, the W-phase Zener diode 51 of the upper arm 31. The surge path R2 is an electrical path along which the surge current flows from, for example, the V-phase winding of the stator coil 15 to the V-phase Zener diode 51 of the lower arm 32 and then further to, for example, the W-phase MOSFET 60 of the lower arm 32.

That is, each of the surge paths R1 and R2 is a series circuit of one MOSFET 60 and one Zener diode 51. The MOSFET 60 operates in the same manner as in the normal rectifying operation. Specifically, when the electric potential at the low-potential terminal L (or at the source 63 of the MOSFET 60) becomes higher than the electric potential at the high-potential terminal H (or at the drain 62 of the MOSFET 60), the control IC 70 applies the gate voltage to the gate 61 of the MOSFET 60, thereby turning on the MOSFET 60. Moreover, when the MOSFET 60 is in an ON state, the MOSFET 60 has an operating resistance at room temperature against the flow of electric current therethrough. More particularly, in the present embodiment, the operating resistance of the MOSFET 60 is equal to 2 mΩ.

In addition, the operating resistance of a circuit element (such as the MOSFET 60 or the Zener diode 51) is represented by the equivalent series resistance of the element during operation of the element (or when electric current flows through the element). The operating resistance can be determined based on the relationship between a minute change in the voltage and a minute change in the electric current.

Moreover, when a reverse voltage higher than the breakdown voltage (or Zener voltage) of the Zener diode 51 is applied to the Zener diode 51, electric current flows from the cathode K to the anode A of the Zener diode 51.

However, due to manufacturing tolerances, the breakdown voltage varies between individual Zener diodes. Therefore, if the breakdown voltage of the W-phase Zener diode 51 of the upper arm 31 is lower than the breakdown voltage of the V-phase Zener diode 51 of the lower arm 32, the surge current will flow first to the upper arm 31. Moreover, depending on the magnitude of the difference between the breakdown voltages of the two Zener diodes 51, the surge current may continuously flow only to the upper arm 31.

Figure 7:
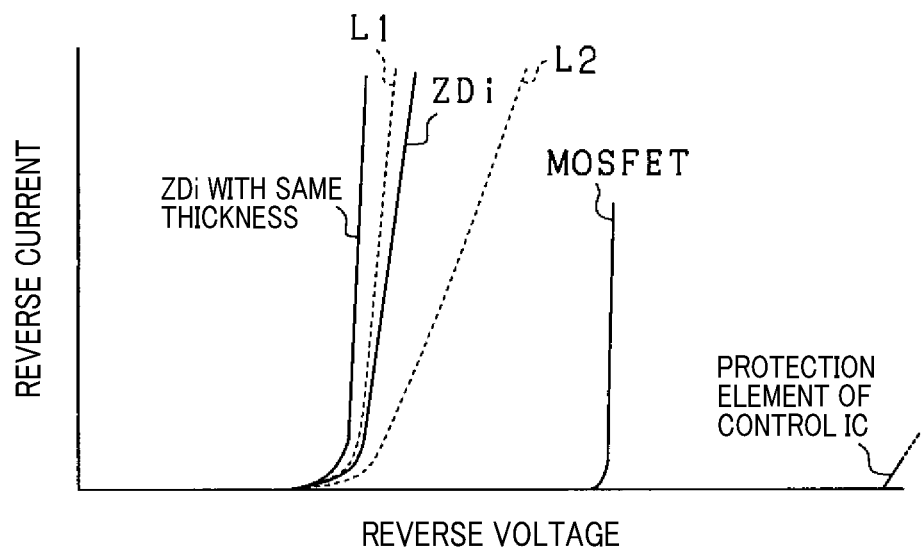
FIG. 7 is a graphical representation illustrating the reverse current-voltage characteristics of different types of components of the rectifying elements of the rectifier according to the first embodiment.

Hereinafter, the operating resistances of the MOSFETs 60 and the Zener diodes 51 when the surge voltage is applied thereto will be described in detail with reference to FIGS. 6 and 7. In addition, FIG. 7 shows the reverse current-voltage characteristics of different types of components of the rectifying elements 50.

In the case of the Zener diodes 51 (abbreviated to "ZDi WITH SAME THICKNESS" in FIG. 7) being formed to have the same chip thickness as the MOSFETs 60, when the reverse voltage exceeds the breakdown voltage of the Zener diodes 51 and thus the Zener diodes 51 undergo reverse breakdown, the operating resistance of each of the Zener diodes 51 at room temperature is small in a region where the slope of the reverse current to the reverse voltage is in the shape of a straight line (more particularly, in a region where the reverse voltage is in the range of 20V-22V). Consequently, in this case, the voltage drops of the surge paths are hardly increased with increase in the surge currents flowing through the surge paths.

Suppose that: the breakdown voltage of the Zener diode 51 included in the surge path R1 is equal to 20V and the breakdown voltage of the Zener diode 51 included in the surge path R2 is equal to 21V; the operating resistance of each of the MOSFETs 60 in the ON state thereof at room temperature is equal to 2 mΩ; the operating resistance of each of the Zener diodes 51, which have the same chip thickness as the MOSFETs 60, at room temperature is 3.9 mΩ; and the rate of increase in the withstand voltage of each of the Zener diodes 51 with respect to temperature is 14 mV/° C. In addition, "the rate of increase in the withstand voltage of each of the Zener diodes 51 with respect to temperature" represents the rate of increase in the voltage drop of each of the Zener diodes 51 with respect to temperature.

For each of the surge paths R1 and R2, the total voltage drop in the surge path can be calculated as the sum of the voltage drop due to both the operating resistances of the MOSFET 60 and the Zener diode 51 included in the surge path, the breakdown voltage of the Zener diode 51, and the amount of increase in the voltage drop of the Zener diode 51 with increase in the temperature thereof.

For example, suppose that the surge current flowing through the surge path R1 is equal to 50A and the amount of increase in the temperature of the Zener diode 51 included in the surge path R1 due to the surge current is equal to 50° C. In this case, the total voltage drop in the surge path R1 can be calculated by the following expression: (50 A×(2 mΩ+3.9 mΩ))+20V+(50° C.×14 mV/° C.).

The total voltage drop in the surge path R1 calculated above is lower than the breakdown voltage of the Zener diode 51 included in the surge path R2 (i.e., 21V). Consequently, in the above case, the surge current continuously flows through only the surge path R1. In other words, of the surge paths R1 and R2, the surge current concentrates on the surge path R1.

In contrast, in the present embodiment, the chip thickness of the Zener diodes 51 (abbreviated to "ZDi" in FIG. 7) is set to be greater than three times the chip thickness of the MOSFETs 60. Consequently, the operating resistance of each of the Zener diodes 51 at room temperature becomes higher than three times the operating resistance of any of the MOSFETs 60 in the ON state thereof at room temperature. More particularly, in the present embodiment, the operating resistance of each of the Zener diodes 51 at room temperature is equal to 10 mΩ.

It should be noted that the operating resistance of each of the Zener diodes 51 at room temperature may be set to any other value in the range of 6 mΩ to 50 mΩ to have the reverse current-voltage characteristic line of the Zener diodes 51 lie between the dashed lines L1 and L2 in FIG. 7.

As above, in the present embodiment, to set the operating resistance of each of the Zener diodes 51 at room temperature to be higher than three times the operating resistance of any of the MOSFETs 60 in the ON state thereof at room temperature, the chip thickness of the Zener diodes 51 is set to be greater than three times the chip thickness of the MOSFETs 60. More specifically, the chip thickness of the Zener diodes 51 is increased by increasing the thickness of the N– layer in each of the Zener diodes 51.

As an alternative, the operating resistance of each of the Zener diodes 51 at room temperature may be adjusted by adjusting the concentration of the dopes (or impurities) injected into the base layers (or substrates) of Zener diodes 51. However, in this case, other parameters, such as the breakdown voltage of each of the Zener diodes 51, would also be changed.

Therefore, in the present embodiment, the operating resistance of each of the Zener diodes 51 at room temperature is adjusted by adjusting the thickness of the semiconductor wafer between the electrode of the anode A and the electrode of the cathode K in each of the Zener diodes 51. More specifically, the thickness of the semiconductor wafer between the electrode of the anode A and the electrode of the cathode K in each of the Zener diodes 51 is set to be greater than three times the thickness of the semiconductor wafer between the electrode of the source 63 and the electrode of the drain 62 in each of the MOSFETs 60.

As in the above-described example regarding the Zener diodes 51 being formed to have the same chip thickness as the MOSFETs 60, suppose that: the breakdown voltage of the Zener diode 51 included in the surge path R1 is equal to 20V and the breakdown voltage of the Zener diode 51 included in the surge path R2 is equal to 21V; the operating resistance of each of the MOSFETs 60 in the ON state thereof at room temperature is equal to 2 mΩ; the rate of increase in the withstand voltage of each of the Zener diodes 51 with respect to temperature is 14 mV/° C.; the total surge current flowing through the surge paths R1 and R2 is equal to 50 A. However, in the present embodiment, the operating resistance of each of the Zener diodes 51 at room temperature is equal to 10 mΩ, not to 3.9 mΩ as in the above-described example. Moreover, suppose that: the rate of increase in the temperature of each of the Zener diodes 51 with respect to the surge current flowing therethrough is equal to 1° C./1 A; the surge current flowing through the surge path R1 is equal to XA; and the amount of increase in the temperature of the Zener diode 51 included in the surge path R1 due to the surge current is equal to 40° C.

Then, in the present embodiment, the total voltage drop in the surge path R1 can be calculated by the following expression: (XA×(2 mΩ+10 mΩ))+20V+(40° C.×14 mV/° C.). Moreover, the surge current XA flowing through the surge path R1 when the total voltage drop in the surge path R1 is equal to the breakdown voltage of the Zener diode 51 included in the surge path R2 can be calculated by the following equation: (XA×(2 mΩ+10 mΩ))+20V+(40° C.×14 mV/° C.)=21V. The result of the calculation is equal to 37 A.

That is, in the present embodiment, when the surge current flowing through the surge path R1 exceeds 37 A, the total voltage drop in the surge path R1 becomes higher than the breakdown voltage of the Zener diode 51 included in the surge path R2, causing the surge current to flow through the surge path R2 as well. In other words, the surge current is not concentrated on one of the surge paths R1 and R2, but distributed to both of the surge paths R1 and R2. Consequently, it becomes possible to effectively absorb the surge current.

An alternative method of making the total voltage drop in the surge path R1 higher than the breakdown voltage of the Zener diode 51 included in the surge path R2 is to select the Zener diodes 51 such that the difference between the breakdown voltages of the Zener diodes 51 is small. However, this method is not realistic because of the time and effort required for the selection of the Zener diodes 51.

Another alternative method of making the total voltage drop in the surge path R1 higher than the breakdown voltage of the Zener diode 51 included in the surge path R2 is to increase the operating resistance of the MOSFET 60 included in the surge path R1 and thereby increase the sum of the operating resistances of the MOSFET 60 and the Zener diode 51 included in the surge path R1. However, with this method, the loss occurring in the MOSFET 60 during the normal rectifying operation due to the operating resistance of the MOSFET 60 will be increased accordingly. Therefore, it is not preferable to use this method.

In view of the above, in the present embodiment, the sum of the operating resistances of the MOSFET 60 and the Zener diode 51 included in the surge path R1 is increased by setting the operating resistance of the Zener diode 51 to be higher than three times the operating resistance of the MOSFET 60. Moreover, considering the case where the breakdown voltage of the Zener diode 51 included in the surge path R1 is higher than the breakdown voltage of the Zener diode 51 included in the surge path R2, the operating resistance of each of the Zener diodes 51 included in the surge paths R1 and R2 is set to be higher than three times the operating resistance of any of the MOSFETs 60 included in the surge paths R1 and R2.

Moreover, yet another alternative method of making the total voltage drop in the surge path R1 higher than the breakdown voltage of the Zener diode 51 included in the surge path R2 is to rely on the amount of increase in the voltage drop of the Zener diode 51 included in the surge path R1 with increase in the temperature thereof. However, with this method, since it takes time for the temperature of the Zener diode 51 included in the surge path R1 to increase, it also takes time for the voltage drop of the Zener diode 51 included in the surge path R1 to increase with increase in the temperature thereof. Consequently, with this method, it is difficult to quickly make the total voltage drop in the surge path R1 higher than the breakdown voltage of the Zener diode 51 included in the surge path R2. Moreover, when the temperature of the Zener diode 51 included in the surge path R1 increases to such a level as to make the total voltage drop in the surge path R1 higher than the breakdown voltage of the Zener diode 51 included in the surge path R2, the Zener diode 51 included in the surge path R1 may adversely affect the other components of the rectifier 30. Therefore, it is not preferable to use this method.

In contrast, in the present embodiment, the operating resistance of each of the Zener diodes 51 is set to be higher than three times the operating resistance of any of the MOSFETs 60, thereby making the total voltage drop in the surge path R1 higher than the breakdown voltage of the Zener diode 51 included in the surge path R2. Consequently, it becomes possible to quickly make the total voltage drop in the surge path R1 higher than the breakdown voltage of the Zener diode 51 included in the surge path R2 without causing the Zener diode 51 included in the surge path R1 to adversely affect the other components of the rectifier 30.

To allow the rectifying elements 50 to withstand the surge voltage due to load damp, it is necessary to not only suppress increase in the temperatures of the Zener diodes 51 of the rectifying elements 50 but also prevent the surge voltage from being applied to the MOSFETs 60 and the control ICs 70 of the rectifying elements 50. Moreover, when electrical stress, such as electrostatic surge, is applied to the rectifying elements 50, it is necessary to prevent the surge voltage from exceeding the withstand voltage of the control ICs 70 of the rectifying elements 50.

Hereinafter, with reference to FIG. 7, an explanation will be made of the withstand voltages of different types of components of the rectifying elements 50 against the reverse voltage when the surge voltage is applied to the rectifying elements 50. In addition, for each of the components of the rectifying elements 50, the withstand voltage of the component against the reverse voltage is represented by the value of the reverse voltage above which the reverse current flows through the component.

In the present embodiment, the withstand voltage of each of the MOSFETs 60 (more specifically, the withstand voltage of each of the parasitic diodes 64 of the MOSFETs 60) against the reverse voltage is set to be sufficiently higher than the breakdown voltage of each of the Zener diodes 51 against the reverse voltage. More specifically, the withstand voltage of each of the MOSFETs 60 against the reverse voltage is set to be substantially equal to 30V. Therefore, the magnitude relationship between the withstand voltage of each of the MOSFETs 60 against the reverse voltage and the breakdown voltage of each of the Zener diodes 51 against the reverse voltage will not be changed by manufacturing tolerances. Consequently, when the surge voltage is applied to the rectifying elements 50, the surge current reliably flows through the Zener diodes 51 of the rectifying elements 50 without any reverse current flowing through the MOSFETs 60 of the rectifying elements 50.

Moreover, in the present embodiment, the withstand voltage of each of the control ICs 70 (more specifically, the withstand voltage of each of the protection elements 72 of the control ICs 70) against the reverse voltage is set to be sufficiently higher than the withstand voltage of each of the MOSFETs 60 against the reverse voltage as well as than the breakdown voltage of each of the Zener diodes 51 against the reverse voltage. More specifically, the withstand voltage of each of the control ICs 70 against the reverse voltage is set to be substantially equal to 38V. Therefore, the magnitude relationship between the withstand voltage of each of the control ICs 70 against the reverse voltage and the breakdown voltage of each of the Zener diodes 51 against the reverse voltage will not be changed by manufacturing tolerances. Consequently, when the surge voltage is applied to the rectifying elements 50, the surge current reliably flows through the Zener diodes 51 of the rectifying elements 50 without any reverse current flowing through the control ICs 70 of the rectifying elements 50.

According to the present embodiment, it is possible to achieve the following advantageous effects.

When a surge voltage is applied from the stator coils 15 to the rectification circuits 30 of the rectifier 40, a reverse voltage is applied to each of the Zener diodes 51 of the upper and lower arms 31 and 32 of the rectification circuits 30. The reverse voltage may exceed the breakdown voltages of the Zener diodes 51 of either of the upper and lower arms 31 and 32, thereby turning on these Zener diodes 51. In the present embodiment, the operating resistance of each of the Zener diodes 51 is set to be higher than three times the operating resistance of any of the MOSFETs 60. Therefore, increase in the surge current flowing through the turned-on Zener diodes 51 is limited. Hence, when surge paths are first formed in one of the upper and lower arms 31 and 32, increase in the surge current flowing through the surge paths is limited, causing surge paths to be formed in the other of the upper and lower arms 31 and 32 as well. Consequently, the surge current is not concentrated on the one of the upper and lower arms 31 and 32, but distributed to both of the upper and lower arms 31 and 32. As a result, it becomes possible to reliably absorb the surge current while suppressing generation of heat in the Zener diodes 51 due to the surge current.

Moreover, in the present embodiment, the operating resistance of each of the Zener diodes 51 is set to be higher than 6 mΩ. Consequently, it becomes possible to reliably cope with variation in the breakdown voltages of the Zener diodes 51 due to manufacturing tolerances.

On the other hand, when the operating resistance of each of the Zener diodes 51 is too high, the voltage drop due to the operating resistance of each of the Zener diodes 51 will become too large with increase in the surge current flowing through the Zener diodes 51. Consequently, it may become impossible to reliably absorb the surge current.

In view of the above, in the present embodiment, the operating resistance of each of the Zener diodes 51 is set to be lower than 50 mΩ. Consequently, it becomes possible to reliably absorb the surge current while effectively coping with variation in the breakdown voltages of the Zener diodes 51 due to manufacturing tolerances.

In the present embodiment, the withstand voltage of each of the MOSFETs 60 against the reverse voltage is set to be higher than the breakdown voltage of each of the Zener diodes 51. Consequently, when the surge voltage is applied to the rectifying elements 50, the surge current reliably flows through the Zener diodes 51 of the rectifying elements 50 without any reverse current flowing through the MOSFETs 60 of the rectifying elements 50.

Moreover, in the present embodiment, the withstand voltage of each of the control ICs 70 against the reverse voltage is set to be higher than the withstand voltage of each of the MOSFETs 60 against the reverse voltage. Consequently, it becomes possible to reliably prevent the surge current from flowing through the control ICs 70 that are most sensitive to the surge current.

In the present embodiment, the thickness of the semiconductor wafer between the electrode of the anode A and the electrode of the cathode K in each of the Zener diodes 51 is set to be greater than three times the thickness of the semiconductor wafer between the electrode of the source 63 and the electrode of the drain 62 in each of the MOSFETs 60. Consequently, it becomes possible to easily and reliably set the operating resistance of each of the Zener diodes 51 to be higher than three times the operating resistance of any of the MOSFETs 60.

Second Embodiment

A rectifier 40 according to the second embodiment has a similar configuration to the rectifier 40 according to the first embodiment. Therefore, only the differences therebetween will be described hereinafter.

In the first embodiment, in each of the rectifying elements 50, the MOSFET 60 and the Zener diode 51 are separately formed into two different chips.

Figure 8:
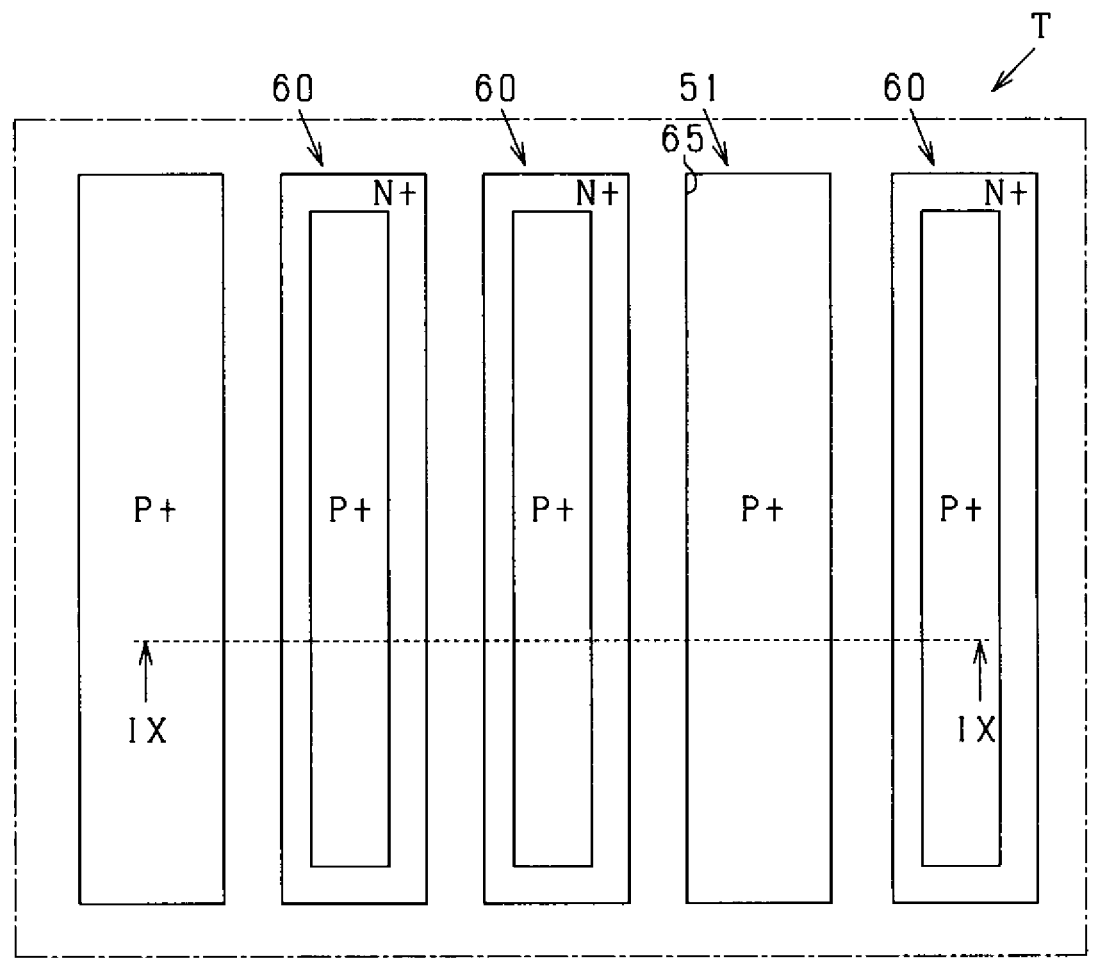
FIG. 8 is a plan view of part of a semiconductor chip employed in a rectifier according to a second embodiment.
Figure 9:
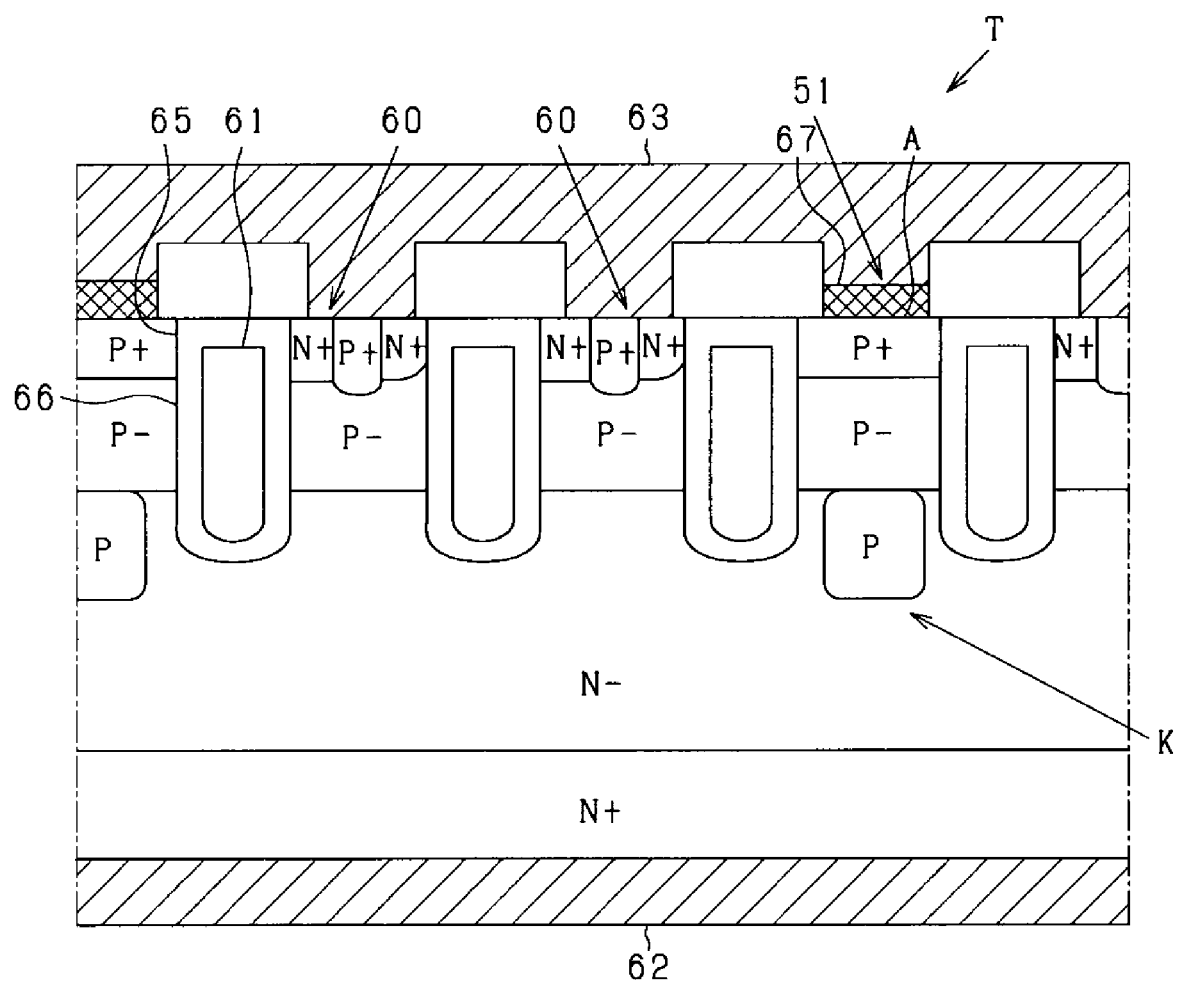
FIG. 9 is a cross-sectional view taken along the line IX-IX in FIG. 8.

In contrast, in the present embodiment, as shown in FIGS. 8 and 9, in each of the rectifying elements 50, the MOSFET 60 and the Zener diode 51 are integrally formed into a single semiconductor chip T.

The semiconductor chip T is arranged on the base electrode 55 to occupy an area which is occupied by both the MOSFET 60 and the Zener diode 51 in the first embodiment. In addition, in the present embodiment, the base electrode 55 has no protrusion 55A formed therein unlike in the first embodiment.

FIG. 8 shows part of the semiconductor chip T in which the MOSFETs 60 and the Zener diodes 51 of the rectifying elements 50 are integrally formed on the same semiconductor wafer.

In addition, peripheral parts of the semiconductor chip T are not shown in FIGS. 8 and 9. The semiconductor chip T has a trench structure for avoiding influence of the chip end faces and a connection structure for externally connecting the electrodes of the gates 61 of the MOSFETs 60.

FIG. 9 shows the trench structure of the semiconductor chip T.

As shown in FIG. 9, one major face (i.e., the upper end face in FIG. 9) of the semiconductor chip T constitutes the electrodes of the sources 63 of the MOSFETs 60 while the other major face (i.e., the lower end face in FIG. 9) of the semiconductor chip T constitutes the electrodes of the drains 62 of the MOSFETs 60.

Moreover, the MOSFETs 60 have an N-type trench structure in which: the electrodes of the gates 61 of the MOSFETs 60 are respectively arranged in trenches 65 via insulating films 66; and the side surfaces of the trenches 65 respectively constitute the channels of the MOSFETs 60.

In each of the MOSFETs 60, a P layer, which constitutes a body region of the semiconductor chip T, is electrically connected to the electrode of the source 63 via a P+ layer. Moreover, between the P layer and an N− layer, there is formed the parasitic diode 64 (see FIG. 3).

In the semiconductor chip T, the Zener diodes 51 are separated from the MOSFETs 60 by the trenches 65. In each of the Zener diodes 51, the anode A constituted of a P+ layer is electrically connected to the electrodes of the sources 63 of the MOSFETs 60 via a resistor 67 that is formed, for example, of polysilicon. In addition, the resistor 67 is shaped to have the operating resistance of the Zener diode 51 satisfying the reverse current-voltage characteristic of the Zener diode 51 as shown in FIG. 7.

Moreover, in the semiconductor chip T, each of the Zener diodes 51 is formed between two of the MOSFETs 60. Electric current, which flows from the sources 63 of the MOSFETs 60, enters the N− layer, then spreads to those parts of the N− layer which respectively constitute the cathodes K of the Zener diodes 51, and finally flows to the drains 62 of the MOSFETs 60.

Consequently, with the MOSFETs 60 and the Zener diodes 51 integrally formed into the same semiconductor chip T, it becomes possible to mitigate increase in the operating resistances of the MOSFETs 60.

Moreover, when the reverse voltage applied to the Zener diodes 51 is higher than the breakdown voltage of the Zener diodes 51 and thus the reverse current flows through the Zener diodes 51, a large amount of heat will be generated in the Zener diodes 51. However, the heat generated in the Zener diodes 51 will be transferred to the MOSFETs 60 adjacent to the Zener diodes 51, thereby being effectively dissipated to the base electrodes 55 of the MOSFETs 60.

Furthermore, with the semiconductor chip T formed into the trench structure, it becomes possible to easily form the Zener diodes 51 respectively in those regions in the semiconductor chip T which are separated from one another by the trenches 65. Consequently, it becomes possible to easily form the MOSFETs 60 and the Zener diodes 51 of the rectifying elements 50 on the same semiconductor wafer.

Third Embodiment

A rectifier 40 according to the third embodiment has a similar configuration to the rectifier 40 according to the second embodiment. Therefore, only the differences therebetween will be described hereinafter.

In the second embodiment, in each of the rectifying elements 50, the Zener diode 51 is employed as the protection diode connected in parallel with the MOSFET 60.

Figure 10:
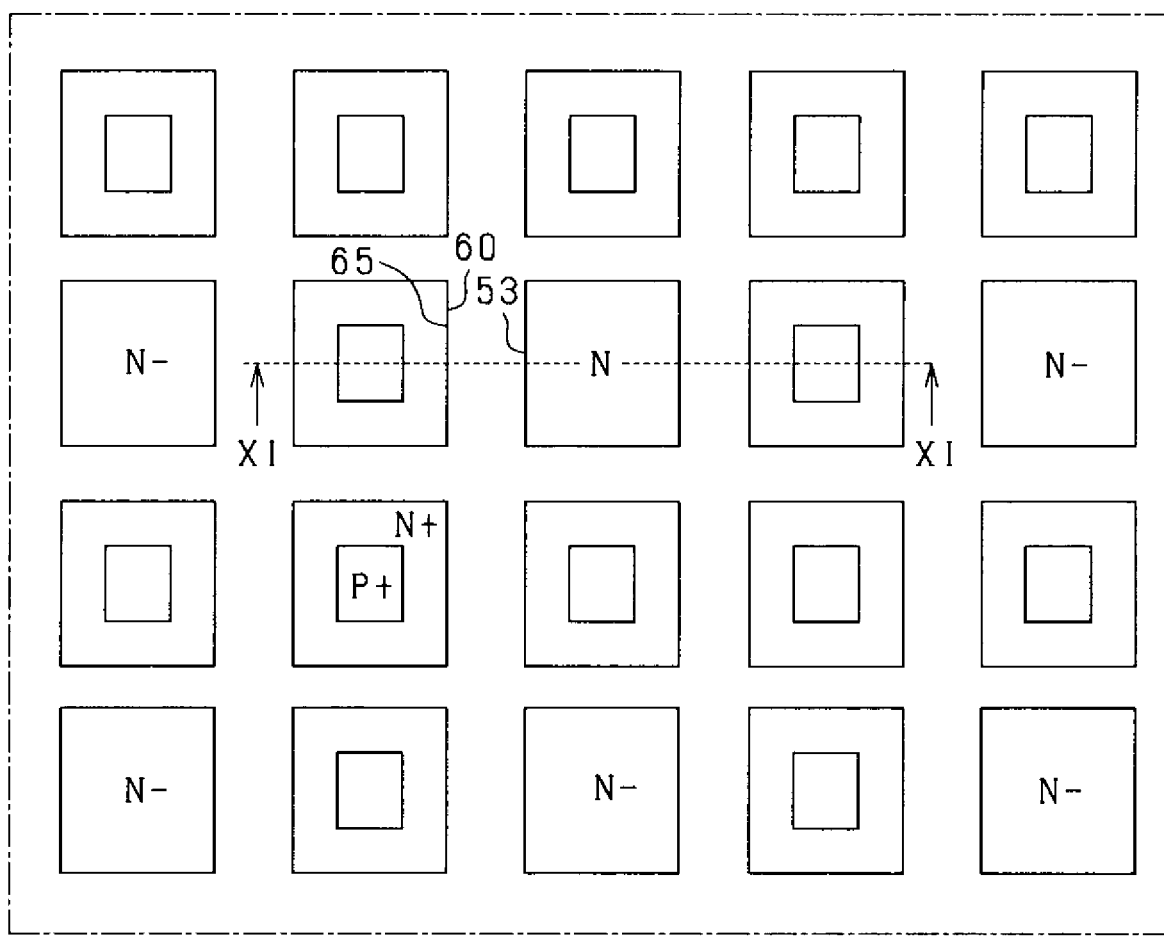
FIG. 10 is a plan view of part of a semiconductor chip employed in a rectifier according to a third embodiment.
Figure 11:
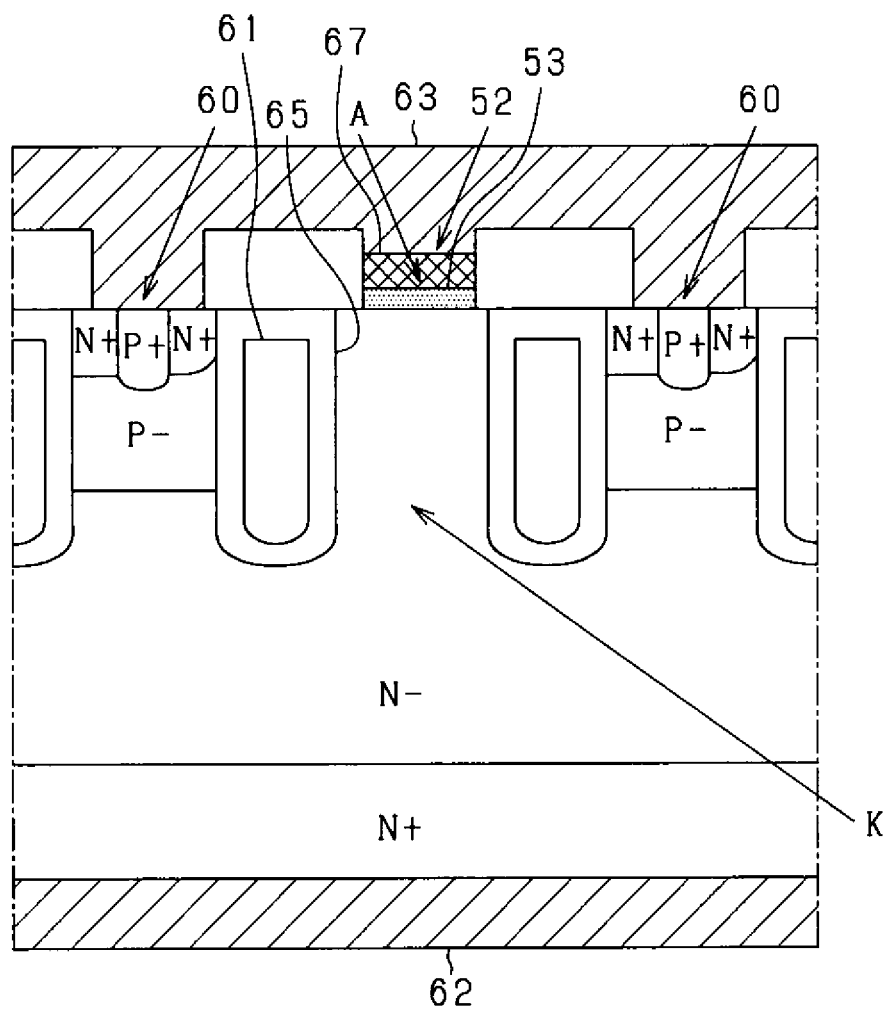
FIG. 11 is a cross-sectional view taken along the line XI-XI in FIG. 10.

In contrast, in the present embodiment, as shown in FIGS. 10 and 11, in each of the rectifying elements 50, a Schottky diode 52 is employed, instead of the Zener diode 51, as the protection diode connected in parallel with the MOSFET 60.

Moreover, in the present embodiment, the MOSFETs 60 and the Schottky diodes 52 of the rectifying elements 50 are integrally formed on the same semiconductor wafer.

Furthermore, as in the second embodiment, the MOSFETs 60 have an N-type trench structure. Each of the Schottky diodes 52 is formed between two of the MOSFETs 60. In addition, the Schottky diodes 52 are respectively formed in those regions in the semiconductor chip T which are separated from one another by the trenches 65.

In each of the Schottky diodes 52, the cathode K is constituted of an N− layer. The electrode of the anode A, which constitutes a Schottky electrode 53, is connected to one surface (i.e., the lower surface in FIG. 11) of a resistor 67 that is surrounded by an insulating film. The other surface (i.e., the upper surface in FIG. 11) of the resistor 67, which is on the opposite side to the Schottky electrode 53, is connected to the electrodes of the sources 63 of the MOSFETs 60.

According to the present embodiment, it is possible to achieve the advantageous effects as described in the second embodiment.

Moreover, in the present embodiment, with the Schottky diodes 52 employed as the protection diodes of the rectifying elements 50, it is possible to suppress a positive voltage surge to the drains 62 of the MOSFETs 60. Furthermore, with the forward voltage of the Schottky diodes 52 lower than the forward voltage of the parasitic diodes 64 of the MOSFETs 60, it is possible to prevent overcurrent from flowing to the parasitic diodes 64 when a negative voltage is applied to the drains 62 of the MOSFETs 60.

While the above particular embodiments have been shown and described, it will be understood by those skilled in the art that various modifications, changes, and improvements may be made without departing from the spirit of the present disclosure.

For example, in the first embodiment, in each of the rectifying elements 50, to offset the difference between the chip thicknesses of the MOSFET 60 and the Zener diode 51, there is formed the protrusion 55A in the base electrode 55. As an alternative, a block electrode may be provided between the MOSFET 60 and the base electrode 55. As another alternative, a protrusion may be formed in the lead electrode 56.

In the second and third embodiments, the MOSFETs 60 of the rectifying elements 50 are configured to have the trench structure. As an alternative, the MOSFETs 60 may be configured to have a planar structure.

In the first embodiment, the rectifying elements 50 are formed into a package structure. As an alternative, all the rectifying elements 50 may be arranged on a substrate and electrically connected with one another.

What is claimed is:

1. A rectifier for a rotating electric machine, the rotating electric machine comprising a rotating shaft, a rotor fixed on the rotating shaft to rotate together with the rotating shaft, and a stator configured to generate multi-phase alternating current therein with rotation of the rotor, the rectifier having a rectification circuit formed therein, the rectification circuit being configured as a multi-phase bridge circuit, which has an upper arm and a lower arm, to rectify the multi-phase alternating current generated in the stator into direct current, the rectifier comprising:

a plurality of upper-arm semiconductor switching elements for respective phases included in the upper arm of the rectification circuit;

a plurality of upper-arm protection diodes for respective phases included in the upper arm of the rectification circuit, each of the upper-arm protection diodes being electrically connected in parallel with one of the upper-arm semiconductor switching elements which is of the same phase as the upper-arm protection diode;

a plurality of lower-arm semiconductor switching elements for respective phases included in the lower arm of the rectification circuit; and a plurality of lower-arm protection diodes for respective phases included in the lower arm of the rectification circuit, each of the lower-arm protection diodes being electrically connected in parallel with one of the lower-arm semiconductor switching elements which is of the same phase as the lower-arm protection diode, wherein each of the upper-arm and lower-arm protection diodes is configured to have, when a reverse voltage higher than a breakdown voltage of the protection diode is applied to the protection diode, an operating resistance that is higher than three times an operating resistance of any of the upper-arm and lower-arm semiconductor switching elements.

2. The rectifier as set forth in claim 1, wherein the operating resistance of each of the upper-arm and lower-arm protection diodes is higher than 6 mΩ.

3. The rectifier as set forth in claim 1, wherein the operating resistance of each of the upper-arm and lower-arm protection diodes is lower than 50 mΩ.

4. The rectifier as set forth in claim 1, wherein each of the upper-arm and lower-arm semiconductor switching elements is a MOSFET, and
a withstand voltage of the MOSFET against a reverse voltage applied between a drain and a source of the MOSFET is higher than the breakdown voltage of each of the upper-arm and lower-arm protection diodes.

5. The rectifier as set forth in claim 4, further comprising a controller that controls switching of the MOSFET based on a voltage between the drain and the source of the MOSFET, wherein the controller is electrically connected between the drain and the source of the MOSFET in parallel with the MOSFET, and a withstand voltage of the controller against the reverse voltage applied between the drain and the source of the MOSFET is higher than the withstand voltage of the MOSFET against the reverse voltage.

6. The rectifier as set forth in claim 1, wherein each of the upper-arm and lower-arm protection diodes is formed of a semiconductor wafer having a first thickness, each of the upper-arm and lower-arm semiconductor switching elements is formed of a semiconductor wafer having a second thickness, and the first thickness is greater than three times the second thickness.

7. The rectifier as set forth in claim 1, wherein each of the upper-arm and lower-arm protection diodes is a Zener diode, and the upper-arm and lower-arm protection diodes are integrally formed with the upper-arm and lower-arm semiconductor switching elements on a same semiconductor wafer.

8. The rectifier as set forth in claim 7, wherein each of the upper-arm and lower-arm semiconductor switching elements is a MOSFET with a trench structure, and the upper-arm and lower-arm protection diodes are separated from one another by the trench structure.

9. The rectifier as set forth in claim 1, wherein each of the upper-arm and lower-arm protection diodes is a Schottky diode, each of the upper-arm and lower-arm semiconductor switching elements is a MOSFET, and the upper-arm and lower-arm protection diodes are integrally formed with the upper-arm and lower-arm semiconductor switching elements on a same semiconductor wafer.

10. The rectifier as set forth in claim 9, wherein each of the upper-arm and lower-arm semiconductor switching elements is a MOSFET with a trench structure, and the upper-arm and lower-arm protection diodes are separated from one another by the trench structure.

11. A rotating electric machine including the rectifier as set forth in claim 1.

12. The rectifier as set forth in claim 1, wherein when a surge current is generated in the stator and flows through the rectifier, the surge current is distributed to the upper arm and the lower arm.

* * * * *